(12) United States Patent
Fang et al.

(10) Patent No.: US 9,085,700 B2
(45) Date of Patent: Jul. 21, 2015

(54) COATING COMPOSITION AND USES THEREOF

(75) Inventors: Fu-Chuan Fang, Kaohsiung (TW);
Jia-Hong Chen, Kaohsiung (TW);
Jui-Yi Hung, Kaohsiung (TW);
Ching-Chang Wen, Kaohsiung (TW)

(73) Assignees: ETERNAL CHEMICAL CO., LTD., Kaohsiung (TW); NEW E MATERIALS CO., LTD., Kaohsiung County (TW)

( * ) Notice: Subject to any disclaimer, the term of this patent is extended or adjusted under 35 U.S.C. 154(b) by 79 days.

(21) Appl. No.: 13/543,265

(22) Filed: Jul. 6, 2012

(65) Prior Publication Data

US 2013/0177759 A1    Jul. 11, 2013

(30) Foreign Application Priority Data

Jan. 6, 2012  (TW) .............................. 101100626 A

(51) Int. Cl.
| | | |
|---|---|---|
| C09D 5/00 | (2006.01) | |
| C09D 1/00 | (2006.01) | |
| C09D 7/12 | (2006.01) | |
| C23C 18/12 | (2006.01) | |
| H01L 31/0216 | (2014.01) | |
| H01L 31/18 | (2006.01) | |

(52) U.S. Cl.
CPC ................ C09D 1/00 (2013.01); C09D 7/1233 (2013.01); C09D 7/1266 (2013.01); C23C 18/1216 (2013.01); C23C 18/1241 (2013.01); C23C 18/1245 (2013.01); C23C 18/1254 (2013.01); C23C 18/1283 (2013.01); H01L 31/02167 (2013.01); H01L 31/1868 (2013.01); Y02E 10/50 (2013.01); Y10T 428/257 (2015.01); Y10T 428/265 (2015.01)

(58) Field of Classification Search
CPC .......... C09D 1/00; C09D 5/00; C09D 1/1233; C09D 7/1266; Y10T 428/265; Y10T 428/257; Y02E 10/50; C23C 18/1216; C23C 18/1241; C23C 18/1245; C23C 18/1254; C23C 18/1283; H01L 31/1868; H01L 31/02167
USPC ...................................................... 106/287.17
See application file for complete search history.

(56) References Cited

U.S. PATENT DOCUMENTS

2004/0044127 A1* 3/2004 Okubo et al. ................ 525/54.3

OTHER PUBLICATIONS

Pinkas et al, Inorg. Chem., 1993, 32, 2711-2716.*
Lacey et al, "Mass spectral study of the vapour of aluminum 2,2',2"-nitrilotriethoxide", Aust. J. Chem., 1976, 29, 1119-1121.*
Fernandez et al, "Theoretical study of oligomeric alumatranes present in the chemistry . . . ", Theo. Chem. 850 (2008) 94-104.*
Verkade, Acc. Chem. Res., 1993, 26, 483-489.*

* cited by examiner

Primary Examiner — David M Brunsman
(74) Attorney, Agent, or Firm — Greer, Burns & Crain, Ltd.

(57) ABSTRACT

A coating composition is provided. The coating composition comprises (a) an aluminum oxide precursor and (b) a solvent, wherein the aluminum oxide precursor (a) comprises aluminum elements and the following groups bound thereon:

(a1) a —$OR^1$ group, wherein $R^1$ is H or a substituted or unsubstituted C1 to C13 alkyl;
(a2) a bidentate chelating group; and
(a3) a tetrahedral coordinating group, wherein, the amount of the aluminum oxide precursor (a) is about 1 wt % to about 50 wt %, based on the total weight of the composition, and the total amount of the groups (a1), (a2) and (a3) is no more than 3 moles per 1 mole of the aluminum elements. The coating composition can be used in a semiconductor process for providing a passivation layer.

14 Claims, 1 Drawing Sheet

COATING COMPOSITION AND USES THEREOF

This application claims priority to Taiwan Patent Application No. 101100626 filed on Jan. 6, 2012.

CROSS-REFERENCES TO RELATED APPLICATIONS

Not applicable.

BACKGROUND

1. Field of the Invention

The present invention relates to a coating composition which can be used in semiconductor preparation, especially in crystalline silicon solar cell preparation. The coating composition can be coated onto a substrate to form a passivation layer thereon, so that the recombination possibility of electron-hole pairs can be reduced and the photovoltaic conversion efficiency can be improved.

2. Descriptions of the Related Art

With the rapid development of technology and economy, the demand for energy has grown significantly. The energy storages used conventionally, including petroleum, natural gas and coal, have gradually decreased. Solar energy is now one of the most valued and important new energy sources because it has low pollution and is easy to obtain.

FIG. 1 shows a schematic diagram of a typical solar cell, wherein an n type doping layer 2 is formed on a p type silicon semiconductor substrate 1 by doping. An anti-reflective layer 3 (such as silicon nitride) and electrodes 4 are subsequently formed on the n type doping layer 2. A back electrode 5 is formed on the other side of the p type silicon semiconductor substrate 1. The conducting types of the silicon semiconductor substrate 1 and the doping layer 2 may be exchanged with each other (i.e., a combination of an n type silicon semiconductor substrate and a p type doping layer is possible). When light irradiates the internal electric field formed between the p type silicon semiconductor substrate 1 and the n type doping layer 2, the electrons of the silicon atoms will be excited to generate light-generated electron-hole pairs. The carriers of the electron-hole pairs will then concentrate on both sides of the cell due to the electric field; and the electric power inside the cell can be utilized by means of connecting an external circuit to the electrodes.

However, the electron-hole pairs are usually recombined inside the solar cell and cannot be utilized, resulting in the reduced photovoltaic conversion efficiency of the solar cell. It is known that such recombination can be reduced through a "back surface field effect." In detail, an electro-negative passivation layer (such as an aluminum oxide layer) is formed between the back electrode 5 and the p type silicon semiconductor substrate 1 to restrict the migrating direction of the minority carriers. By such means, the migration of electrons toward the back electrode 5 can be reduced, thereby, the recombination possibility of electron-hole pairs can be reduced (i.e. lengthening the life-time of the minority carriers) and the photovoltaic conversion efficiency can be thus, increased. Said aluminum oxide layer may be provided by a dry process, such as atomic layer deposition (ALD), chemical vapor deposition (CVD), sputtering, etc., or a wet process. In the dry process, a high vacuum environment is required and the growth rate of aluminum oxide is extremely slow, resulting in high costs. In contrast, the wet process can be performed by the sol-gel method which is relatively simple and less costly. However, the particle size of the aluminum oxide layer prepared by the sol-gel method is uncontrollable and non-uniform and the stability of the solution of the sol-gel process is poor, therefore, it is hard to control and commercialize the process.

SUMMARY

The present invention relates to a coating composition which can be stored for a long time without deterioration, i.e. without precipitation or gelation. The passivation layer prepared therefrom has fine and uniform aluminum oxide particles and is capable of providing an outstanding back electric field effect to raise the passivation effect and lengthen the life-time of the minority carriers, and thereby, improve the photovoltaic conversion efficiency while being applied in the solar cell.

An objective of the present invention is to provide a coating composition, comprising the following:
(a) an aluminum oxide precursor, comprising aluminum elements and the following groups bound thereon:
  (a1) a —OR$^1$ group, wherein R$^1$ is H or a substituted or unsubstituted C1 to C13 alkyl;
  (a2) a bidentate chelating group; and
  (a3) a tetrahedral coordinating group; and
(b) a solvent,
wherein the amount of the aluminum oxide precursor (a) is about 1 wt % to about 50 wt %, based on the total weight of the composition, and the total amount of the groups (a1), (a2) and (a3) is no more than 3 moles per 1 mole of the aluminum elements.

Another objective of the present invention is to provide a composite material comprising a substrate and a passivation layer coated onto the surface of the substrate, wherein the passivation layer is formed by the coating composition of the present invention and provides the effects of lengthening the life-time of the minority carriers and improving the photovoltaic conversion efficiency.

To render the above objectives, technical features and advantages of the present invention more apparent, the present invention will be described in detail with reference to some embodiments hereinafter.

DETAILED DESCRIPTION

Figure 1:
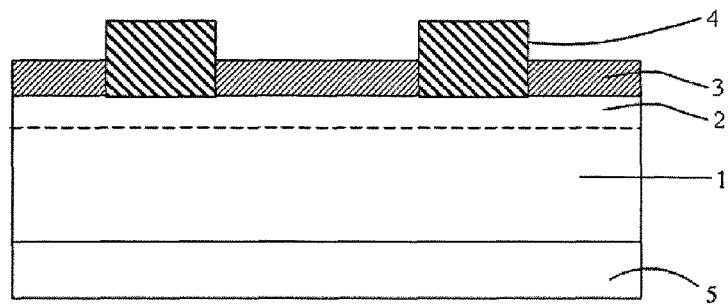
FIG. 1 shows a schematic diagram of a typical solar cell.

Hereinafter some terms are defined as follows for better understanding the disclosure of the specification.

The term "alkyl" refers to a straight or branched carbon chain group.

The term "alkylene" refers to a straight or branched divalent carbon chain group, which may be optionally substituted.

The term "alkoxy" refers to a group connecting with the rest part of the molecule (e.g., the alkyl described above) through an oxygen atom.

The term "aryl" refers to a monocyclic or polycyclic aromatic group. The example of the aryl includes but not limited to phenyl, naphthyl, fluorenyl, azulenyl, anthryl, phenanthryl, pyrenyl, biphenylyl and terphenylyl. The aryl also refers to a bicyclic or tricyclic carbon ring, wherein one of the carbon rings is an aromatic ring and other carbon ring(s) may be a saturated, partially-unsaturated, or aromatic ring, such as dihydronaphthyl, indenyl, dihydroindenyl or tetrahydroindenyl (tetralone).

The following will describe some embodiments of the present invention in detail. However, without departing from the spirit of the present invention, the present invention may be embodied in various embodiments and should not be limited to the embodiments described in the specification. In addition, unless it is additionally explained, the expressions "a," "the," or the like recited in the specification (especially in the claims) should include the singular and the plural forms. Furthermore, the term "substituted" here means that H is substituted by a substituent which can be any groups or atoms other than "H." For example, the substituent may be a halogen, a hydroxyl, a cyano, a carboxyl, an alkyl, an epoxy or an alkoxy. Moreover, for clarity, the size of each element and each area may be exaggerated in the attached drawings and is not depicted to their actual scale.

The coating composition of the present invention is a stable solution containing an aluminum oxide precursor, which can be stored for a long time without viscosity variation or deterioration (such as precipitation or gelation). Furthermore, the aluminum oxide precursor of the present invention can maintain its stable solution property without agglomeration either in the acidic or basic environment, and this allows a broader application scope.

Specifically, the coating composition of the present invention comprises (a) an aluminum oxide precursor and (b) a solvent, wherein the aluminum oxide precursor is stably presented in the solvent (b) and comprises aluminum elements and the following groups bound thereon:

(a1) a —$OR^1$ group;

(a2) a bidentate chelating group; and (a3) a tetrahedral coordinating group,

In the group (a1), $R^1$ is H or a substituted or unsubstituted C1 to C13 alkyl, preferably H or a substituted or unsubstituted C1 to C4 alkyl. In some embodiments of the present invention, R1 is H. As mentioned above, the expressions "a" recited in the specification includes the singular and the plural forms and thus, it should be realized that the coating composition of the present invention may comprise one kind or more than one kind of aluminum oxide precursor. In the case where the coating composition comprises one kind of aluminum oxide precursor, the coating composition comprises only one kind of —$OR^1$ group (a1), one kind of bidentate chelating group (a2) and one kind of tetrahedral coordinating group (a3). In another case where the coating composition comprises multiple kinds of aluminum oxide precursors, the coating composition of the present invention may comprise multiple kinds of aluminum oxide precursors such that the coating composition may comprise one or more kinds of —$OR^1$ groups (a1), bidentate chelating groups (a2) and tetrahedral coordinating groups (a3).

The coating composition of the present invention comprises a bidentate chelating group (a2) that can effectively restrain the polymerization between the molecules of the aluminum oxide precursor to increase the stability of the aluminum oxide precursor and control the size and uniformity of the aluminum oxide particles formed therefrom. The species of the bidentate chelating group (a2) are not particularly limited. As those illustrated in the following examples, the bidentate chelating group (a2) may be

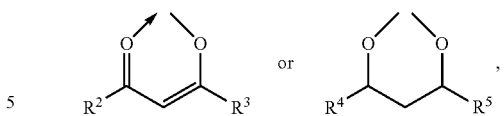

and preferably

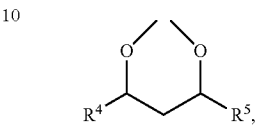

wherein $R^2$ and $R^3$ are identical to or different from each other, $R^4$ and $R^5$ are identical to or different from each other, and each of $R^2$, $R^3$, $R^4$ and $R^5$ is independently H or a substituted or unsubstituted C1 to C10 alkyl or alkoxy. In some embodiments of the present invention, the bidentate chelating group (a2) is selected from the group consisting of

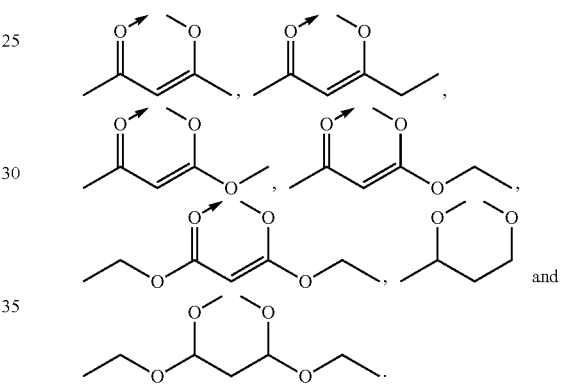

It is believed that only tetrahedral coordinating structured aluminum oxide is capable of providing the desired back electric field effect for solar cells. In view of this, the coating composition of the present invention further comprises a tetrahedral coordinating group (a3) to induce the generation of tetrahedral coordinating structured aluminum oxide to reinforce the back electric field effect and thus, the passivation effect. The species of the tetrahedral coordinating group (a3) are not particularly limited. The tetrahedral coordinating group (a3) may be any metallic or non-metallic tetrahedral coordinating groups, and preferably a non-metallic tetrahedral coordinating group. Specifically, said tetrahedral coordinating group may be —$OYR^7(OR^6)_2$, wherein Y is P.Si.B or Ti, preferably P, Si or B; $R^6$ is H, a substituted or unsubstituted C1 to C15 alkyl or a substituted or unsubstituted C6 to C15 aryl; and $R^7$ is —OH or =O. In some embodiments of the present invention, group (a3) is a non-metallic tetrahedral coordinating group of —$OPO(OR^6)_2$, wherein $R^6$ is H or a C1 to C3 alkyl; for example, group (a3) may be —$OPO(OH)_2$.

In the aluminum oxide precursor of the invention, the total amount of the groups (a1), (a2) and (a3) is no more than 3 moles per 1 mole of the aluminum elements. Preferably, the moles of the group (a1), $M_{a1}$, the moles of the group (a2), $M_{a2}$, and the moles of the group (a3), $M_{a3}$, meet the requirements that $0 \leq M_{a1} < 2.7$; $0.3 \leq M_{a2} \leq 3$; and $0 \leq M_{a3} \leq 0.3$. More preferably, $M_{a1}$, $M_{a2}$ and $M_{a3}$ meet the requirement that $0 < M_{a1} < 2.7$; $0.3 \leq M_{a2} < 3$; and $0 < M_{a3} \leq 0.3$. If the amount of $M_{a2}$ is too low, the polymerization between the molecules of the aluminum oxide precursor may not be effectively restrained, and this may lead to gelation, poor solubility of the aluminum oxide precursor, or poor film-integrality (such as the appearance of a crack) of the passivation layer formed by sintering the aluminum oxide precursor. In addition, a large amount of $M_{a3}$ cannot provide further effects and may reduce the solubility of the aluminum oxide precursor and thus, the stability of the stable solution.

According to the following examples, the aluminum oxide precursor may be

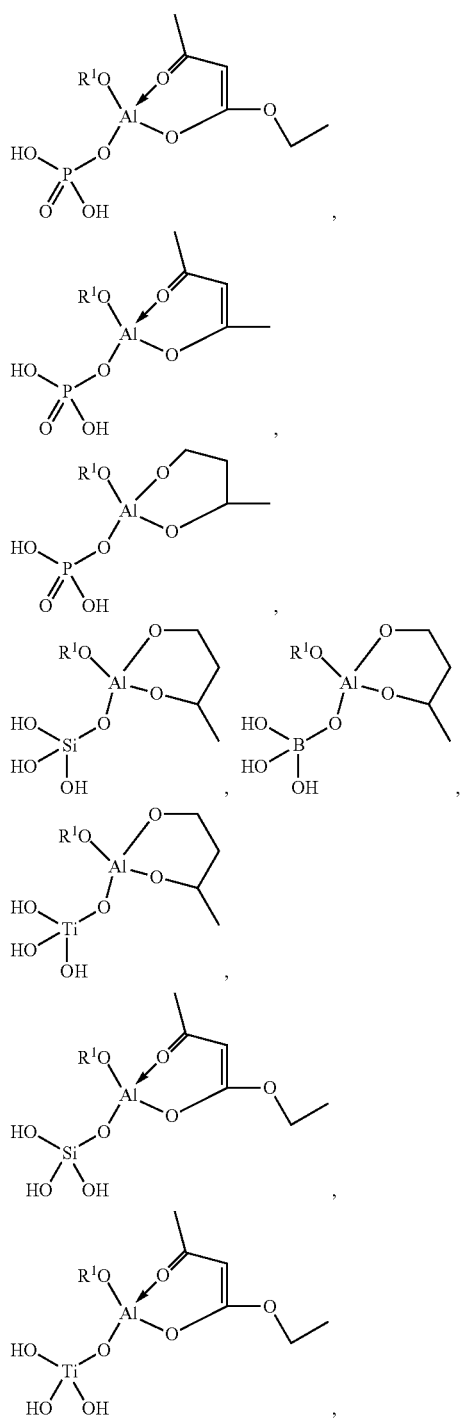

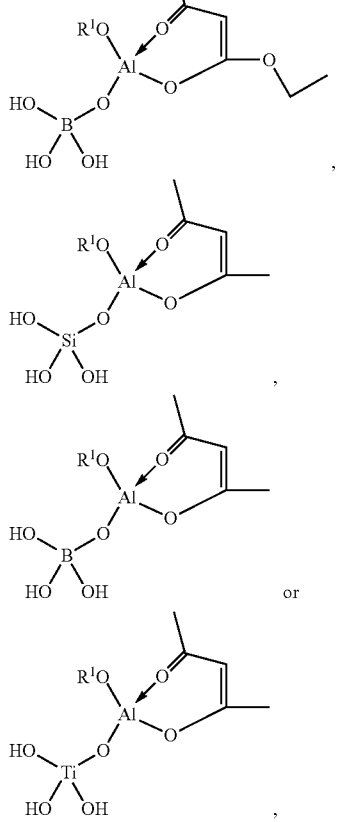

wherein $R^1$ has the definition as mentioned above.

The solvent (b) of the coating composition of the present invention may be any inert solvent which can dissolve (or uniformly disperse) the aluminum oxide precursor and is unreactive to the aluminum oxide precursor. For example, the solvent (b) can be selected from the group consisting of water, alcohols, ethers, esters, ketones and mixtures thereof. In some embodiments of the present invention, the solvent (b) is water and sec-butanol.

It is believed that too low of a concentration of the aluminum oxide precursor (a) is incapable of forming a fully covered aluminum oxide nano-particle layer; and too high of a concentration of the aluminum oxide precursor (a) may render the coating composition too viscous to use, or result in an over-thickened aluminum oxide nano-particle layer which will adversely influence the efficiency of the solar cell. In view of this, in the coating composition of the present invention, the amount of the aluminum oxide precursor (a) is generally about 1 wt % to about 50 wt %, preferably about 4 wt % to about 23 wt %, based on the total weight of the composition.

The coating composition of the present invention comprises an aluminum oxide precursor (a) and a solvent (b), wherein said aluminum oxide precursor (a) comprises an aluminum oxide derivative of $Al(OR^1)_3$, a chelating agent and an inducing agent, and wherein $R^1$ has the definition mentioned above. The method for preparing the coating composition is not particularly limited. According to the preferred embodiments of the present invention, the coating composition is prepared by a sol-gel method characterized by adding the chelating agent and inducing agent to respectively provide the bidentate chelating group (a2) and the tetrahedral coordinating group (a3) during the preparation.

The chelating agent is capable of increasing the stability of the aluminum oxide precursor in the solvent and effectively controlling the size and uniformity of the aluminum oxide particles formed therefrom. The species of the chelating agent are not particularly limited and may be any polydentate ligands (preferably bidentate) capable of forming a coordinate covalent bond with metal. In some embodiments of the present invention, the chelating agent is

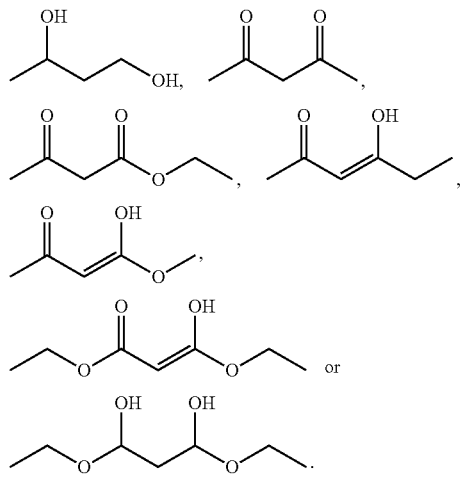

The inducing agent is capable of inducing a generation of tetrahedral coordinating structured aluminum oxide precursor so that the aluminum oxide passivation layer prepared therefrom can provide an excellent back electric field effect for a solar cell. The species of the inducing agent are not particularly limited. In some embodiments of the present invention, the inducing agent is $H_3PO_4$, $(NH_4)_2B_4O_7 \cdot 4H_2O$, $Si(OEt)_4$ or $Ti(OEt)_4$.

Hereinafter a method comprising the following steps are provided for illustrating the preparation method of the coating composition of the present invention, wherein the aluminum oxide derivative is $Al(OR^1)_3$ ($R^1$ has the definition as mentioned above), the chelating agent is

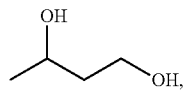

and the inducing agent is $H_3PO_4$. However, the preparation method of the coating composition of the present invention is not limited thereto.

(i) An aluminum oxide derivative $Al(OR^1)_3$ is dissolved into the solvent and then, a chelating agent is added with full agitation, thereby, carrying out the following reaction:

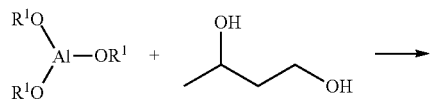

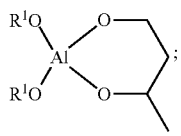

(ii) the inducing agent is added into the mixed solution obtained from step (i) with full agitation, thereby, carrying out the following reaction:

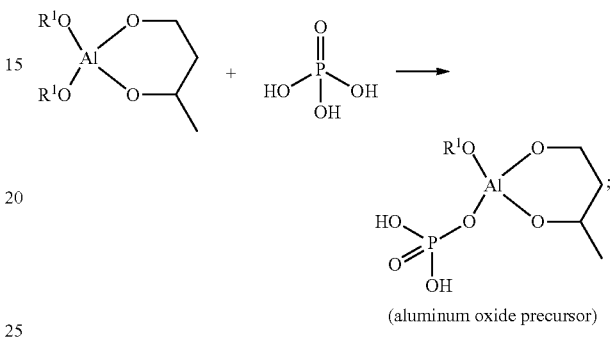

(aluminum oxide precursor)

and (iii) after the reaction is complete, the pH value of the resultant solution is optionally adjusted with an acid (such as nitric acid) or base to obtain the coating composition of the present invention.

In addition to the above method, persons with ordinary skills in the art can optionally apply other methods to prepare the coating composition of the present invention on the basis of the disclosure of the specification. In other words, the preparation method of the coating composition of the present invention is not limited to the above method.

The present invention further provides a composite material comprising a substrate and a passivation layer. The passivation layer is formed by coating the coating composition mentioned above on at least one surface of the substrate by a known method, such as a screen printing method, coating method, spray method and dipping method; and drying and sintering the casted substrate. For example, the coating method may be carried out though the following methods known to persons with ordinary skills in the art: slot die coating method, micro gravure coating method, roller coating method, dip coating method, spray coating method, spin coating method, curtain coating method and combinations thereof. The species of said substrate are not particularly limited. For example, the substrate may be a ceramic substrate, a silicon substrate or a metallic substrate. In addition, during the preparation of the composite material of the present invention, the sintering temperature can be chosen by users as long as it is capable of providing the desired sintering effect while not damaging the substrate, and it is generally about 300° C. to about 700° C.

In the past, the passivation layer of a composite material was formed by a dry process, which had to be carried out in a high vacuum environment with a long preparation duration, resulting in high costs. Recently, people have tried to use a wet process to form the passivation layer, but the particle size of the aluminum oxide layer prepared thereby is uncontrollable and non-uniform and the stability of the solution during the preparation is poor. The coating composition of the present invention is formed by a simple and economical sol-gel method, wherein by the addition of the chelating agent, the polymerization between the molecules of the aluminum oxide precursor can be effectively restrained to increase the stability of the aluminum oxide precursor in the solvent and effectively control the size and uniformity of the aluminum oxide particles formed therefrom. Thus, the disadvantages of the known wet process are overcome. In addition, by adding the inducing agent, the generation of tetrahedral coordinating structured aluminum oxide can be induced to enhance the back electric field effect and thus, improve the passivation effect of the passivation layer.

According to the present invention, the passivation layer comprises a plurality of aluminum oxide particles. Those aluminum oxide particles are amorphous aluminum oxide particles and their shape is not particularly limited. For example, they may be spherical, elliptic or irregular. To provide a good back electric field effect, the average particle size of the aluminum oxide particles is generally about 5 nm to about 30 nm, preferably about 8 nm to about 20 nm. The particle size of the aluminum oxide nano-particles provided according to the present invention is very uniform, i.e., the size distribution range of the aluminum oxide particles is narrow. As a result, the nano-scaled aluminum oxide particles of the present invention could provide an aluminum oxide layer with a uniform particle size. The aluminum oxide layer can thereby contract with the substrate with a larger contact area to form a dense bonding therebetween. Therefore, in the application of the solar cell, the passivation layer could provide an excellent back electric field to improve the passivation effect, so that the life time of the minority carriers could be lengthened and the photovoltaic conversion efficacy could be increased.

Said passivation layer generally has a thickness of about 10 nm to about 500 nm, preferably about 40 nm to about 250 nm. In some embodiments of the present invention, said substrate is a p type silicon substrate of a solar cell, and said passivation layer is obtained by sintering the coating composition of the present invention at a temperature of about 500° C. and composed of amorphous aluminum oxide particles with an average particle size of about 10 nm, and has a thickness of about 40 nm to about 200 nm.

The present invention will be further illustrated by the embodiments hereinafter. The embodiments are recited for explication, but not for limiting the scope of the present invention.

EXAMPLES

The Preparation of the Coating Composition

Example 1

1 mole of Al(OC$_4$H$_9$)$_3$ and 1 mole of

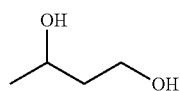
(chelating agent 1)

were dissolved in sec-butanol with agitation, and then 0.01 moles of phosphoric acid and 33 g of water were added thereinto to carry out a hydrolysis reaction. Finally, nitric acid was added into the resultant mixture to adjust the pH value to about 4.5 to obtain coating composition 1. The state of the solution condition after 60 days storage was observed and the result was tabulated in Table 1.

Example 2

1 mole of Al(OC$_4$H$_9$)$_3$ and 1 mole of

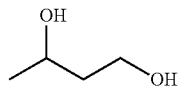
(chelating agent 1)

were dissolved in sec-butanol with agitation, and then 0.01 moles of phosphoric acid and 36 g of water were added thereinto to carry out a hydrolysis reaction. Finally, nitric acid was added into the resultant mixture to adjust the pH value to about 4.5 to obtain coating composition 2. The state of coating composition after 60 days storage was observed and the result was tabulated in Table 1.

Example 3

The procedures of Example 1 were repeated to prepare a coating composition 3, except for replacing the chelating agent 1 with

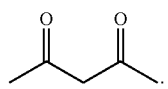
(chelating agent 2)

The state of coating composition after 60 days storage was observed and the result was tabulated in Table 1.

Example 4

The procedures of Example 1 were repeated to prepare coating composition 4, except for replacing the chelating agent 1 with

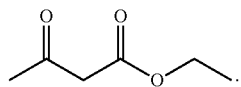
(chelating agent 3)

The state of coating composition after 60 days storage was observed and the result was tabulated in Table 1.

Example 5

The procedures of Example 1 were repeated to prepare coating composition 5, except for changing the amount of the chelating agent 1 to 0.25 moles. The state of coating composition after 60 days storage was observed and the result was tabulated in Table 1.

Example 6

The procedures of Example 1 were repeated to prepare coating composition 6, except for changing the amount of the chelating agent 1 to 2.2 moles. The state of coating composition after 60 days storage was observed and the result was tabulated in Table 1.

Example 7

The procedures of Example 1 were repeated to prepare coating composition 7, except for changing the amount of phosphoric acid to 0.2 moles. The state of coating composition after 60 days storage was observed and the result was tabulated in Table 1.

Example 8

The procedures of Example 1 were repeated to prepare coating composition 8, except for changing the amount of phosphoric acid to 0.35 moles. The state of coating composition after 60 days storage was observed and the result was tabulated in Table 1.

Example 9

The procedures of Example 1 were repeated to prepare coating composition 9, except for adjusting the pH value to about 7 by nitric acid. The state of coating composition after 60 days storage was observed and the result was tabulated in Table 1.

Example 10

The procedures of Example 1 were repeated to prepare coating composition 10, except for adjusting the pH value to about 12 by nitric acid. The state of coating composition after 60 days storage was observed and the result was tabulated in Table 1.

Example 11

1 mole of $Al(OC_4H_9)_3$ and 1 mole of

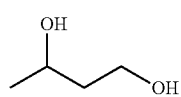

(chelating agent 1)

were dissolved in sec-butanol with agitation, and then 33 g of water was added thereinto to carry out a hydrolysis reaction. Finally, nitric acid was added to adjust the pH value to about 4.5 to obtain coating composition 11. The state of coating composition after 60 days storage was observed and the result was tabulated in Table 1.

Comparative Example 12

1 mole of $Al(OC_4H_9)_3$ and 0.01 moles of phosphoric acid were dissolved in sec-butanol with agitation, and then 33 g of water was added thereinto to carry out a hydrolysis reaction. Finally, nitric acid was added to adjust the pH value to about 4.5 to obtain coating composition 12. The state of coating composition after 60 days storage was observed and the result was tabulated in Table 1.

As can be seen from Examples 1 and 2, the coating composition of the present invention can maintain clear without precipitation despite the amount of the aluminum oxide precursor.

As can be seen from Examples 1, 3 and 4, the coating composition of the present invention can have good solution stability despite the species of chelating agents.

As can be seen from Examples 1 and 5, too low of an amount of chelating agent cannot sufficiently restrain the polymerization between the molecules of the aluminum oxide precursor; and the solution stability of the coating composition is thus, deteriorated.

As can be seen from Examples 1 and 8, too high of an amount of phosphoric acid may lead to the deterioration of the solution stability of the coating composition (precipitation is observed). Without being restricted by any theories, it is believed that this is due to the increase of the hydrophilicity of the aluminum oxide precursor itself.

As can be seen from Examples 1, 9 and 10, the coating composition can be optionally adjusted into any pH values without affecting the solution stability of the coating composition.

Figure 2:
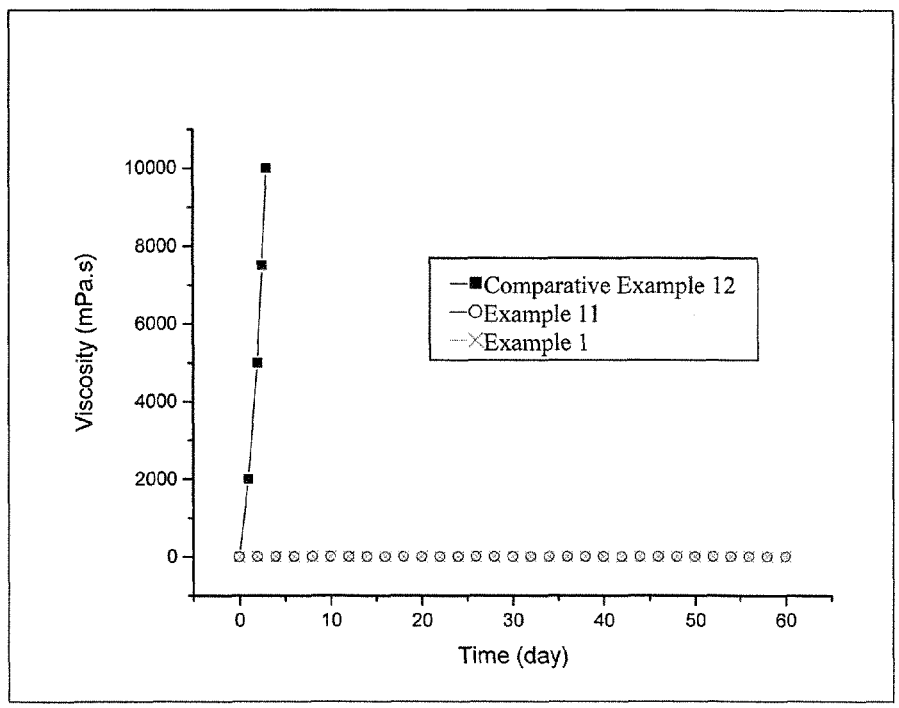
FIG. 2 shows the viscosity-time plots of the coating compositions of the present invention and the comparative coating composition.

FIG. 2 shows the viscosity testing results of Examples 1 and 11 and Comparative Example 12. As can be seen from FIG. 2, the addition of the chelating agent can effectively restrain the polymerization between the molecules of the aluminum oxide precursor and thus, avoid possible precipitation. Therefore, even after being stored for a long time, the coating composition of the present invention is still clear (see Examples 1 and 11). In contrast, in the absence of the chelating agent (Comparative Example 12), the coating composition generates precipitates because of the polymerization between the molecules of the aluminum oxide precursor and thus, cannot be stored for a long time.

[The Preparation of the Composite Material]

The coating compositions of Examples 1 to 8 and 11 and Comparative Example 12 and a commercial aluminum oxide dispersion (EVONLK company, aluminum oxide content: 10 wt %; average particle size of aluminum oxide: 13 nm) were used to prepare composite materials respectively. In detail, the coating composition was spin coated on the front and back sides of a p type silicon wafer to form a film. The coated silicon wafer was sequentially subjected to a low-temperature pre-baking at 110° C. for 10 minutes and then a high-temperature sintering at 500° C. for 30 minutes to form an aluminum oxide layer on the surfaces of the p type silicon wafer. The wafer was then annealed under a mixture atmosphere of nitrogen and hydrogen to obtain the composite material.

TABLE 1

| | | 1 | 2 | 3 | 4 | 5 | 6 | 7 | 8 | 9 | 10 | 11 | 12 |
|---|---|---|---|---|---|---|---|---|---|---|---|---|---|
| aluminum oxide precursor | $Al(OC_4H_9)_3$ (mole) | 1 | 1 | 1 | 1 | 1 | 1 | 1 | 1 | 1 | 1 | 1 | 1 |
| | chelating agent 1 (mole) | 1 | 1 | 0 | 0 | 0.25 | 2.2 | 1 | 1 | 1 | 1 | 1 | 0 |
| | chelating agent 2 (mole) | 0 | 0 | 1 | 0 | 0 | 0 | 0 | 0 | 0 | 0 | 0 | 0 |
| | chelating agent 3 (mole) | 0 | 0 | 0 | 1 | 0 | 0 | 0 | 0 | 0 | 0 | 0 | 0 |
| | phosphoric acid (mole) | 0.01 | 0.01 | 0.01 | 0.01 | 0.01 | 0.01 | 0.2 | 0.35 | 0.01 | 0.01 | 0 | 0.01 |
| solvent | water (g) | 33 | 36 | 33 | 33 | 33 | 33 | 33 | 33 | 33 | 33 | 33 | 33 |
| | sec-butanol (g) | 3606 | 395 | 3606 | 3606 | 3606 | 3606 | 3606 | 3606 | 3606 | 3606 | 3606 | 3606 |
| wt % | | 4.6 | 23.0 | 4.6 | 4.6 | 4.8 | 4.5 | 4.7 | 4.8 | 4.6 | 4.6 | 4.6 | 4.9 |
| pH value | | 4.5 | 4.5 | 4.5 | 4.5 | 4.5 | 4.5 | 4.5 | 4.5 | 7.0 | 12.0 | 4.5 | 4.5 |
| condition of the composition | | clear | clear | clear | clear | turbid | clear | clear | turbid | clear | clear | clear | colloidal |

Blank test: an p type silicon without any coating composition was sequentially subjected to a low-temperature pre-baking at 110° C. for 10 minutes, and a high-temperature sintering at 500° C. for 30 minutes, and then annealed under the mixture atmosphere of nitrogen and hydrogen to obtain a test wafer.

The film integrity, film thickness and the average particle size of aluminum oxide particles of the coating compositions were tested and the results were tabulated in Table 2 respectively. In addition, the life time (the longer the life time, the better the generating efficiency) of the minority carriers of the composite materials and test wafer were tested by WCT-120 (general mode) and the results were tabulated in Table 2. The standard for determining the film integrity was as follows: cutting the surface of the formed aluminum oxide layer by a cross hatch cutter resulting in one hundred grids of small squares, tightly sticking a tape on the surface of the aluminum oxide layer and then vertically pulling off the tape, and inspecting the number of the peeled grids and assessing the film integrity according to the following standard:

the number of rest grids (un-peeled) was more than 90: the film integrity is good and marked in "○";
the number of rest grids (un-peeled) was 70 to 90: the film integrity is acceptable and marked in "Δ"; and
the number of rest grids (un-peeled) was less than 70: the film integrity is poor and marked in "×".

TABLE 2

| | film integrity | film thickness (nm) | average particle size (nm) | life time of carriers (micro-second) |
|---|---|---|---|---|
| Example 1 | ○ | 45.2 | 10 | 778 |
| Example 2 | ○ | 230.1 | 10 | 413 |
| Example 3 | ○ | 46.8 | 12 | 623 |
| Example 4 | ○ | 49.2 | 12 | 673 |
| Example 5 | Δ | 50.7 | 12 | 377 |
| Example 6 | ○ | 42.8 | 10 | 645 |
| Example 7 | ○ | 43.4 | 10 | 801 |
| Example 8 | Δ | 44.7 | 10 | 364 |
| Example 9 | ○ | 45.3 | 10 | 458 |
| Example 10 | ○ | 44.8 | 10 | 469 |
| Example 11 | ○ | 46.7 | 10 | 586 |
| Comparative Example 12 | × | | | |
| commercial aluminum oxide dispersion | × | | | |
| test wafer | | | | 65 |

As shown in Table 2, the particles of the aluminum oxide layer formed by the coating composition of the present invention were very fine (about 10 nm) and uniform. Therefore, the composite material provided therefrom can improve the passivation effect of the nano aluminum oxide layer and provide an excellent back electric field effect, so that the life time of the minority carriers were increased (the life time of the minority carriers is at least 5 times greater than that of the silicon wafer without the aluminum oxide layer) and the generating efficiency of the solar cell was thus improved. In addition, the film integrity of the coating compositions of Comparative Example 12 and the commercial aluminum oxide dispersion were poor and thus, the composite materials provided thereby were not subjected to the subsequent sintering step.

In conclusion, the coating composition of the present invention can be stably stored for a long time without precipitation, and the composite material prepared therefrom is provided with a aluminum oxide layer with fine and uniform aluminum oxide particles. In addition, the composite material has an excellent life time of minority carriers and thus, particularly suitable for solar cells.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A coating composition comprising:
   (a) an aluminum oxide precursor, comprising aluminum elements and following groups bound thereon:
      (a1) a —OR$^1$ group, wherein R$^1$ is H or a substituted or unsubstituted C1 to C13 alkyl;
      (a2) a bidentate chelating group; and
      (a3) a tetrahedral coordinating group; and
   (b) a solvent,
   wherein the amount of the aluminum oxide precursor (a) is about 1 wt % to about 50 wt %, based on the total weight of the composition, and the total amount of the groups (a1), (a2) and (a3) is no more than 3 moles per 1 mole of the aluminum elements, and wherein the moles of the group (a1), $M_{a1}$, the moles of the group (a2), $M_{a2}$ and the moles of the group (a3) $M_{a3}$ meet the following requirements:
   $0 < M_{a1} < 2.7$;
   $0.3 \leq M_{a2} \leq 3$; and
   $0 < M_{a3} \leq 0.3$, per 1 mole of the aluminum elements.

2. The composition of claim 1, wherein R$^1$ is H or a substituted or unsubstituted C1 to C4 alkyl.

3. The composition of claim 1, wherein the group (a2) is

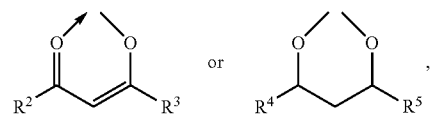

and wherein R$^2$ and R$^3$ are identical to or different from each other, R$^4$ and R$^5$ are identical to or different from each other, and each of R$^2$, R$^3$, R$^4$ and R$^5$ is independently H or a substituted or unsubstituted C1 to C10 alkyl or alkoxy.

4. The composition of claim 3, wherein the group (a2) is selected from the group consisting of:

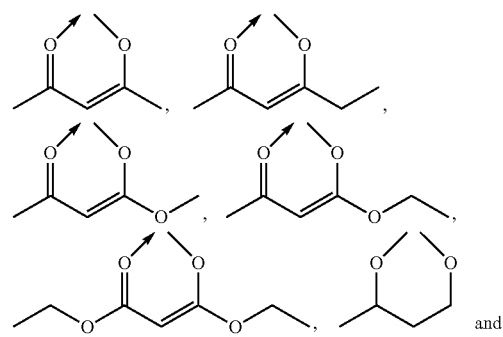

and

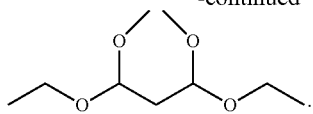

5. The composition of claim 1, wherein the group (a3) is a non-metallic tetrahedral coordinating group.

6. The composition of claim 1, wherein the group (a3) is —OYR$^7$(OR$^6$)$_2$, and wherein Y is P.Si.B or Ti; R$^6$ is H, a substituted or unsubstituted C1 to C15 alkyl or a substituted or unsubstituted C6 to C15 aryl; and R$^7$ is —OH or =O.

7. The composition of claim 6, wherein the group (a3) is —OPO(OR$^6$)$_2$, and R$^6$ is H or a C1 to C3 alkyl.

8. The composition of claim 1, wherein the solvent (b) is selected from the group consisting of water, alcohols, ethers, esters, ketones and mixtures thereof.

9. The composition of claim 1, wherein the amount of the aluminum oxide precursor (a) is about 4 wt % to about 23 wt %, based on the total weight of the composition.

10. A composite material comprising a substrate and a passivation layer, wherein the passivation layer is formed by coating the coating composition of claim 1 on at least one surface of the substrate, and drying and sintering the coated substrate.

11. The composite material of claim 10, wherein the passivation layer has a thickness of about 10 nm to about 500 nm.

12. The composite material of claim 10, wherein the passivation layer comprises a plurality of aluminum oxide particles with an average particle size of about 5 nm to about 30 nm.

13. The composite material of claim 12, wherein the aluminum oxide particles are amorphous aluminum oxide particles.

14. The composite material of claim 10, wherein the substrate is a ceramic substrate, a silicon substrate or a metallic substrate.

* * * * *

UNITED STATES PATENT AND TRADEMARK OFFICE
CERTIFICATE OF CORRECTION

PATENT NO. : 9,085,700 B2  
APPLICATION NO. : 13/543265  
DATED : July 21, 2015  
INVENTOR(S) : Fu-Chuan Fang et al.

It is certified that error appears in the above-identified patent and that said Letters Patent is hereby corrected as shown below:

Title Page Item (73) Assignees, delete "ETERNAL CHEMICAL CO., LTD., Kaohsiung (TW)" and please insert -- "ETERNAL MATERIALS CO., LTD, Kaohsiung (TW)" --.

Signed and Sealed this  
Twelfth Day of July, 2016

Michelle K. Lee  
*Director of the United States Patent and Trademark Office*